(12) United States Patent
Kobayashi et al.

(10) Patent No.: US 6,531,384 B1
(45) Date of Patent: Mar. 11, 2003

(54) METHOD OF FORMING A BOND PAD AND STRUCTURE THEREOF

(75) Inventors: Thomas S. Kobayashi, Austin, TX (US); Scott K. Pozder, Austin, TX (US)

(73) Assignee: Motorola, Inc., Schaumburg, IL (US)

(*) Notice: Subject to any disclaimer, the term of this patent is extended or adjusted under 35 U.S.C. 154(b) by 0 days.

(21) Appl. No.: 09/952,527

(22) Filed: Sep. 14, 2001

(51) Int. Cl.[7] ............................................. H01L 21/44
(52) U.S. Cl. ..................... 438/612; 438/665; 438/666; 438/738
(58) Field of Search .................. 438/612, 665–666, 438/672, 687, 735, 737, 738, 756

(56) References Cited

U.S. PATENT DOCUMENTS

| | | | |
|---|---|---|---|
| 5,244,534 A | * 9/1993 | Yu et al. ........................ | 438/672 |
| 5,382,831 A | 1/1995 | Atakov et al. ................. | 257/767 |
| 5,904,563 A | * 5/1999 | Yu ................................ | 438/672 |
| 5,976,971 A | * 11/1999 | Kinpara et al. ............... | 438/637 |
| 6,114,187 A | * 9/2000 | Hayes .......................... | 438/106 |
| 6,287,950 B1 | * 9/2001 | Wu et al. ...................... | 438/612 |
| 6,306,750 B1 | * 10/2001 | Huang et al. ................. | 438/612 |
| 6,383,935 B1 | * 5/2002 | Lin et al. ...................... | 438/692 |
| 6,482,741 B1 | * 11/2002 | Ueno ............................ | 438/687 |

FOREIGN PATENT DOCUMENTS

| | | | | |
|---|---|---|---|---|
| WO | WO 99/59194 | 11/1999 | ........... | H01L/21/00 |

* cited by examiner

*Primary Examiner*—Amir Zarabian
*Assistant Examiner*—Jamie L. Brophy
(74) *Attorney, Agent, or Firm*—James L. Clingan, Jr.; Kim-Marie Vo

(57) ABSTRACT

A bond pad is formed by first providing a planarized combination of copper and silicon oxide features in a bond pad region. The silicon oxide features are etched back to provide a plurality recesses in the copper in the bond pad region. A corrosion barrier is formed over the copper and the silicon oxide features in the recesses. Probing of the wafer is done by directly applying the probe to the copper. A wire bond is directly attached to the copper. The presence of the features improves probe performance because the probe is likely to slip. Also the probe is prevented from penetrating all the way through the copper because the recessed features are present. With the recesses in the copper, the wire bond more readily breaks down and penetrates the corrosion barrier and is also less likely to slip on the bond pad.

20 Claims, 3 Drawing Sheets

METHOD OF FORMING A BOND PAD AND STRUCTURE THEREOF

FIELD OF THE INVENTION

This invention pertains, generally, to the field of semiconductors and more specifically to the field of bond pads on semiconductors.

BACKGROUND OF THE INVENTION

As the industry moves to replace aluminum with copper in semiconductor processing, enabling a copper wire bond to attach to copper bond pads is needed. One problem with copper bond pads is that when chemically mechanically polishing (CMP) them, dishing can occur. A solution is to form oxide slots in the copper bond pad to improve planarization. Oxide slots, however, make it difficult to contact the metal with the probe needle or wire bond reliably. Without slotting, not only is the CMP process more difficult, but also the probe needle can damage the pads so that the ability to wire bond is compromised. Therefore a need exists for a bond pad structure that allows for the existence of slotting and both wire bonding of copper wires to copper bond pads and probe needle contact reliability.

BRIEF DESCRIPTION OF THE DRAWINGS

The present invention is illustrated by way of example and not by limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

In one embodiment, a slotted bond pad including dielectric regions and copper fills is formed to improve wire bonding of copper wires to copper bond pads and probe needle reliability. The invention is defined by the claims and better understood by turning to the figures.

Figure 1:
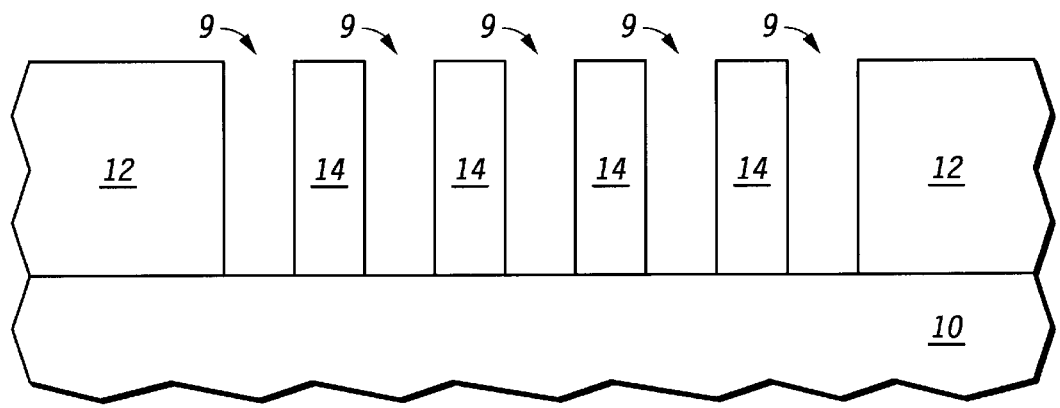
FIG. 1 illustrates a cross section view of a portion of a semiconductor substrate showing the slots in accordance with an embodiment of the present invention.

As shown in FIG. 1, a dielectric layer is formed and patterned over a surface of a semiconductor substrate 10 to form slots 14 and isolation regions 12. As used herein, the term "substrate surface" is used to refer to the top most exposed surface(s) of the features on the substrate 10. The substrate 10 is a semiconductor substrate that has been processed up to, but not including, the formation of bond pads, which occurs during the processing sequences for the last metal layer. Hence, substrate 10 may have transistors, bit lines, word lines, and the like formed within. The substrate 10 has a semiconductor layer such as silicon, gallium arsenide, silicon germanium, and the like, and may includes an insulator such as silicon on insulator (SOI). The dielectric layer is the dielectric layer for the last metal layer and can be formed by chemical vapor deposition (CVD), spin on, the like or combinations of the above. The dielectric layer is a dielectric material that will not substantially react when exposed to air and, for example, can be silicon dioxide formed from using a tetraethylorthosilane (TEOS) gas. In one embodiment, the dielectric layer is about 0.1 to 1 micron in thickness. The slots 14, in one embodiment, are the same thickness as the openings 9 between the slots 14 and in another embodiment, the slots 14 have a maximum width that is no greater than approximately 4 microns. In one embodiment, the slots 14 are an insulating material. There is a benefit to the slots being the same material as the isolations regions 12, because only one deposition and one pattern process are needed. If the slots 14 and the isolation region 12 are different materials more than 1 dielectric material may be deposited and patterned adding cycle time to the manufacturing process.

After forming the slots 14 and the isolation region 12, a first barrier layer (not shown) may be formed over the substrate surface. In one embodiment, the first barrier layer is approximately 400 Angstroms of tantalum formed by PVD. Other refractory metals and their nitrides, such as TiN, Ti, and TaN, can be used as the first barrier layer. Alternately, atomic layer deposition (ALD) or another means can be used. A seed layer (not shown) may be formed over the first barrier layer. In one embodiment, the seed layer is copper formed by PVD to a thickness of approximately 800 to 1500 Angstroms.

Figure 2:
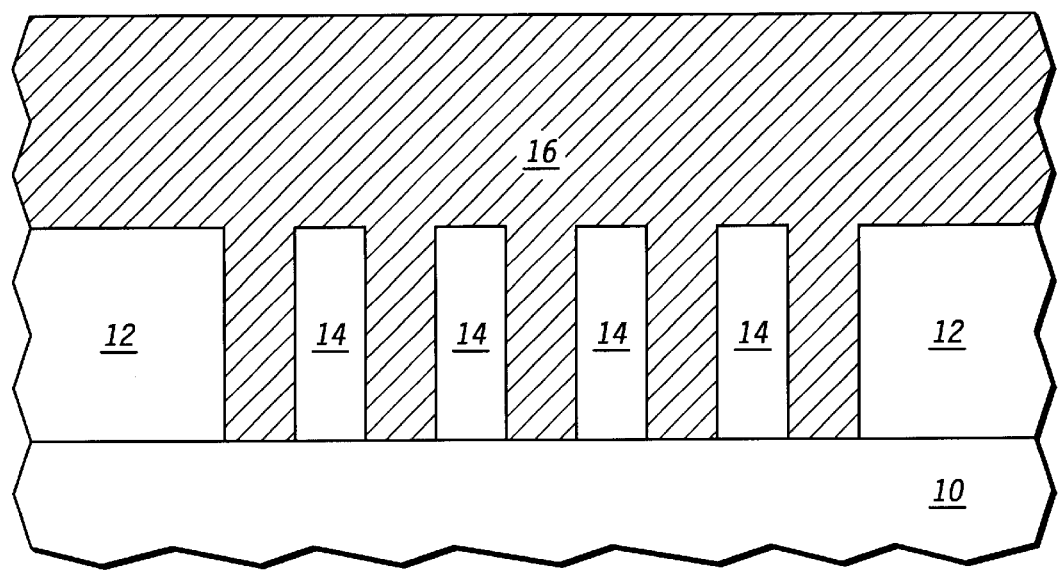
FIG. 2 illustrates the portion of the semiconductor substrate of FIG. 1 with a metal layer formed.

As shown in FIG. 2, a metal layer 16, which is preferably copper, is formed over isolation regions 12 and between and over the slots 14. If the first barrier layer and the seed layer are chosen to be used, the metal layer 16 will be over those as well. In one embodiment, the metal layer 16 is a copper layer and a copper fill, which is deposited among and over the features or slots 14. Other conductive materials, such as tungsten and copper alloys, can be used. The metal layer 16 is formed by electroplating or another suitable process. The amount of metal layer 16 that is formed should be at least as thick as the height of the openings 9. In one embodiment, 8,000 Angstroms of copper is deposited.

Figure 3:
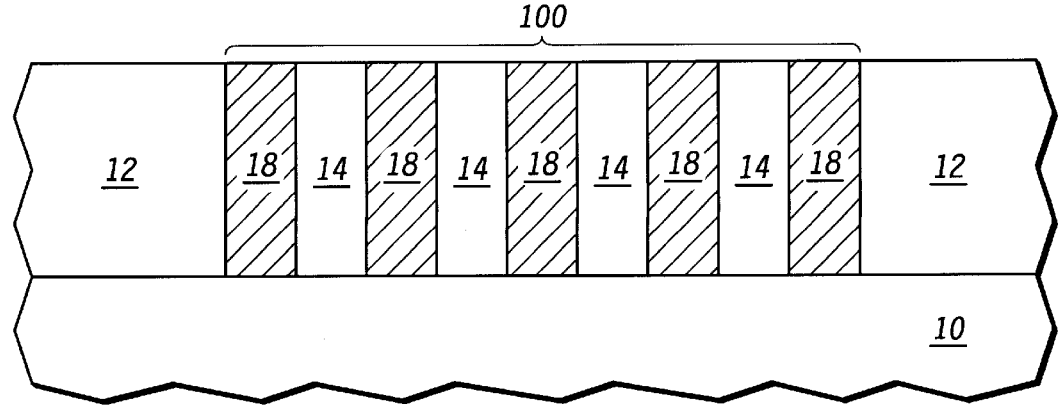
FIG. 3 illustrates the semiconductor substrate of FIG. 2 after planarization.

After forming the metal layer 16, portions of the metal layer 16 are removed, for example, by planarization, to form inlaid structures 18 or metal regions 18, as shown in FIG. 3. Typically, the metal layer 16 is chemically mechanically polished to result in the metal regions 18, which together with the slots 14 form the bond pad 100. Alternately, the metal layer 16 can be etched back to result in the metal regions 18. In the embodiment where the metal layer 16 is a copper layer and a copper fill, the copper layer and the copper fill are planarized to form a substantially planar surface comprising a top surface of the copper fill and a top surface of each of the slots 14. The metal regions 18 and the slots 14 are part of a bond pad 100 or bond pad region 100.

Figure 4:
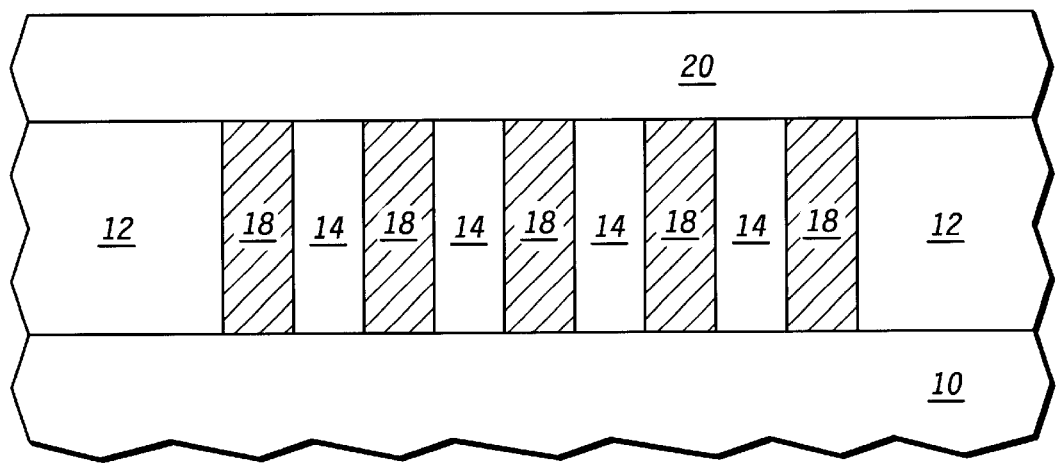
FIG. 4 illustrates the semiconductor substrate of FIG. 3 after formation of passivation layer.
Figure 5:
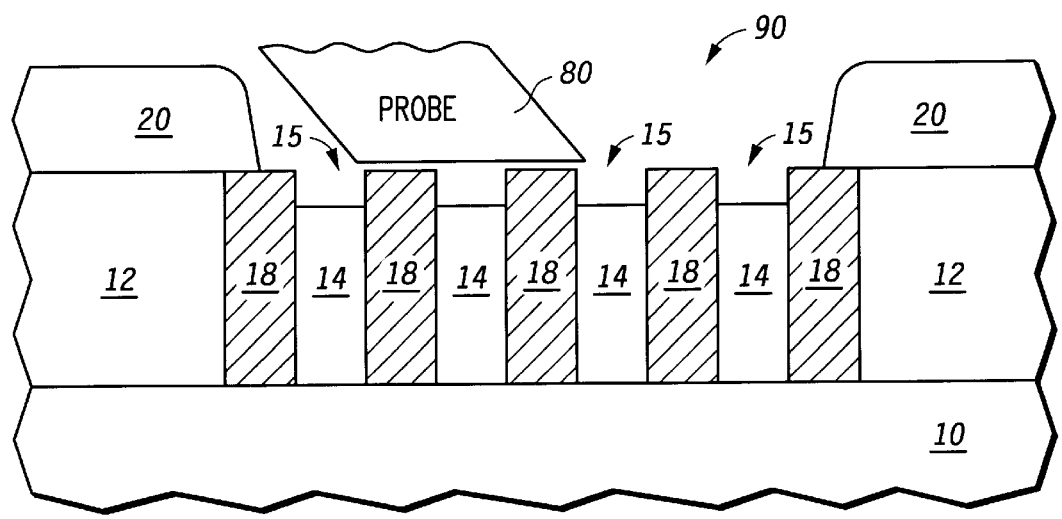
FIG. 5 illustrates the semiconductor substrate of FIG. 4 after patterning and etching the passivation layer.
Figure 6:
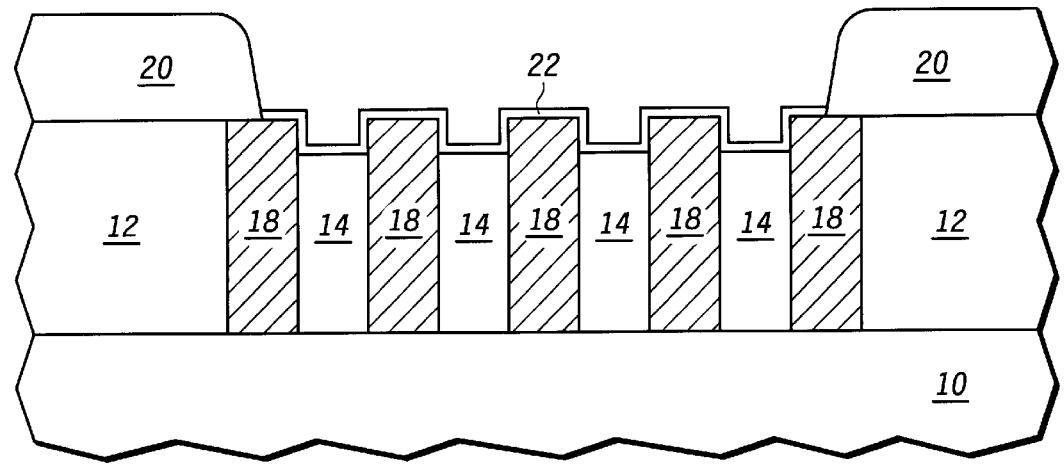
FIG. 6 illustrates the semiconductor substrate of FIG. 5 after forming a corrosion barrier.

As shown in FIG. 4, after forming the bond pad 100, a passivation layer 20 is formed over the bond pad 100 and the isolation regions 12. The passivation layer 20 can be silicon nitride, silicon oxynitride, the like or combinations of the above and can be formed by CVD, PVD, the like or combinations of the above. A 500 Angstroms thick silicon nitride and a 4,500 Angstroms thick silicon oxynitride layer have been found to be effective as the passivation layer 20. Next, the passivation layer 20 is patterned with photoresist and etched to form an opening 90 over at least a portion of the bond pad 100, as shown in FIG. 5. A fluorine-containing chemistry, such as $CF_4$, can be used to etch the passivation layer 20. In one embodiment the opening 90 is formed by an etch-ash-etch process, meaning a first etch, followed by an ash, followed by a second etch, which may or may not be the same as the first etch, is performed. Other suitable methods for forming the opening 90 can be used.

In one embodiment, after forming a first etch to form a portion of the opening 90 and removing the photoresist used in the first etch, a polyimide layer (not shown) is formed over all areas of the substrate 10 and patterned to form openings over bond pad 100 and possibly other areas. A second etch is performed in order to form the remaining portion of the opening 90. The same etch chemistry as used in the first etch may or may not be used. The second etch process will etch any areas not covered by the polyimide layer.

As shown in FIG. 5, while forming the opening 90, an over etch is performed in order to recess the slots 14 below the top surface of the metal regions 18, which in one embodiment are copper fills. In the embodiment where the passivation layer 20 is present, the over etch serves to ensure that the passivation layer 20 is completely removed from the opening 90 to allow for subsequent wire bonding. The height of the copper fills are greater than the height of the plurality of features or slots 14 and the recesses 15 are formed above the slots between the height of the slots and the height of the copper fills. The recesses 15 are at least approximately 100 Angstroms and more specifically, at least about 600 Angstroms. As one of ordinary skill in the art can determine, the depth of the recesses 15 cannot be greater than the height of the slots 14. In one embodiment, the amount of recess is between approximately 100 Angstroms and 2000 Angstroms or more specifically between 600 Angstroms and 2000 Angstroms.

It is desirable to have the recesses 15 deep enough so that when a probe 80 is applied to a portion of the bond pad 100, the probe will slide along the top of the slots 14 and make contact with the metal regions 18, as shown in FIG. 5. The recesses can also allow any debris that has built up on the probe 80 to come off and deposit in at least one recess 15 or be scraped off on the top of the slots 14. In addition, the presence of the slots 14 prevents the probe 80 from contacting the bottom of the metal regions 18 in the bond pad 100 and removing at least portions of the contacted metal regions 18, as is the case in the prior art where no slots are used and results in less contact area for wire bonding.

Using bonds pads where the slots and the metal regions are co-planer prevents sufficient penetration of the bond pad to ensure sufficient contact between the probe and the metal regions. Additionally, contacting the slots with the probe can create nonconductive debris, which can adhere to the tip of the probe and increase pad damage or decrease the ability to electrically contact the metal regions 18.

As can be seen in FIG. 5, in one embodiment, the probe 80 is directly in contact with a portion of the bond pad 100, meaning that the probe is not contacting the portion of the bond pad 100 via an intermediate layer.

After forming the recesses 15, a second barrier layer 22 or corrosion barrier layer 22 is optionally formed over the slots 14 and the metal regions 18 to protect the bond pad 100 from an oxygen-containing or corrosive atmosphere. In one embodiment, the second barrier layer 22 is a thin glass material deposited by CVD or spun on. For example, the second barrier layer 22 can be a material including silicon, carbon, oxygen, and hydrogen such as a film sold in conjunction with Kulicke & Soffa Industries Inc.'s OP2 (SM) Oxidation Prevention Process. The second barrier layer 22 has a thickness less than the height of the recesses 15. In one embodiment, the second barrier layer 22 is less than approximately 100 Angstroms.

Alternately, the second barrier layer 22 can be a corrosion inhibitor in the form of a solid, gel, or liquid. When using a liquid corrosion inhibitor, the corrosion inhibitor is deposited so as to at least partially fill the recesses 15 above the slots 14. By using a liquid corrosion inhibitor the recesses 15 can serve as reservoirs for the liquid, which is released over time due to the wettability of the liquid with the metal regions 18. Thus, the corrosion inhibitor that evaporated off of the top surface of the metal regions 18 is replaced over time by the liquid corrosion inhibitor from the recesses 15 until no more liquid remains. The amount of liquid corrosion inhibitor that can be held within each recess 15 is a function of the volume of the recess 15 of the slots 14. The longer the metal regions 18 need to be protected from an oxygen environment the more liquid corrosion inhibitor is needed and larger the volume of the recesses 15 should be. As one of ordinary skill recognized, the volume of the recess 15 depends on the height of the recess 15 and the diameter or width of the recess 15.

In another embodiment, the second barrier layer 22 is a flux, which can include a chloride or fluoride. Generally, the flux is heated and removes, by etching, any corrosion that has occurred to the metal regions 18. Subsequently the flux evaporates off or is substantially displaced by the ball, which is part of the wire bond, during the wire bonding, as will be further explained below.

If the second barrier layer 22 is not formed, a standard pre-cleaning process may be performed in a nitrogen, hydrogen, argon or the like environment prior to wire bonding. Alternately, the opening 90 can be kept isolated from or minimally exposed to an oxygen environment.

Figure 7:
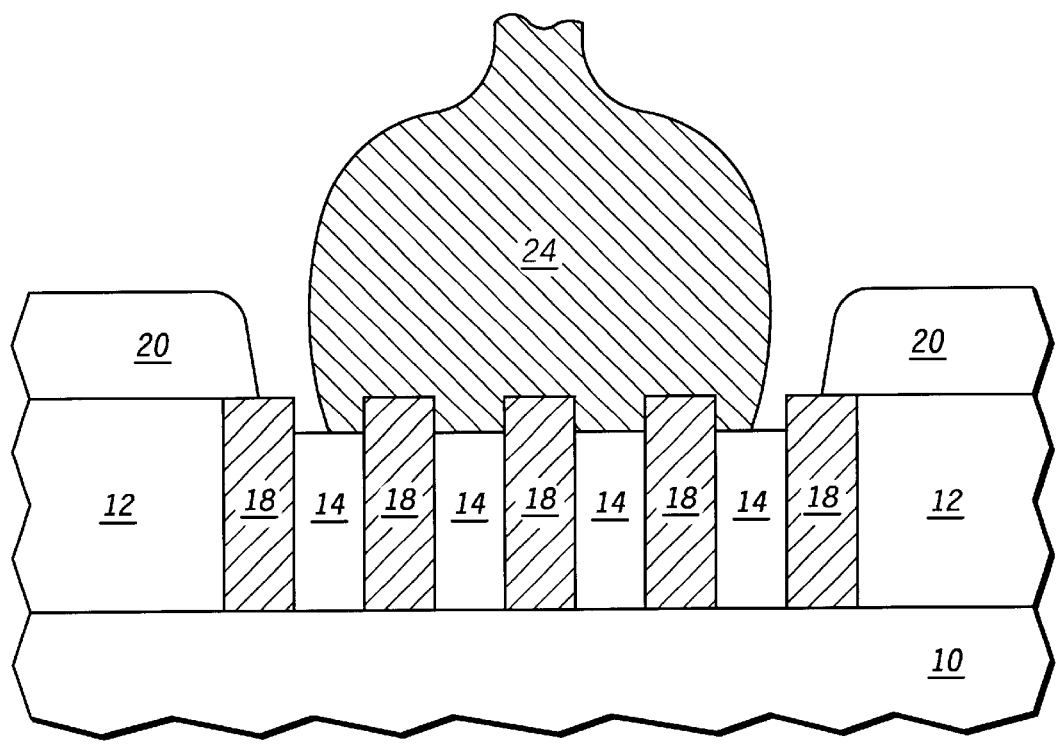
FIG. 7 illustrates a portion of the semiconductor substrate after wire bonding.

After forming the bond pad 100 and the second barrier layer 22, if desired, the semiconductor substrate 10 is attached to a packaging, substrate (not shown) and heated in order to wire bond at least one bond pad 100 on the semiconductor substrate 10 or die to a pad on the packaging substrate in order to make an electrical connection between them. To form a wire bond a metal wire is extruded and then, in one embodiment, heated in order to form a ball at the end of the wire. A anvil or annular needle is then used to sweep the ball and wire to the bond pad 100. Ultrasonic power and pressure are applied to the wire bond 24 by the annular needle in order for the wire bond 24 to directly adhere to the bond pad 100, meaning that the wire or wire bond 24 is not contacting the portion of the bond pad 100 via an intermediate layer. In one embodiment, the wire or wire bond 24 directly attaches directly to the top surface of the copper fill, wherein directly has the same meaning as previously stated. The resulting structure is shown in FIG. 7. The wire bond 24 can be a ball, wedge, or any other suitable shape.

If the second barrier layer 22 is used and is a corrosion inhibitor it may be present only prior to or during wire bonding. Alternately, if a flux is used as the second barrier layer 22, the flux may be present prior to, during or after wire bonding. Generally, the flux is displaced during wire bonding and heating drives off the corrosion inhibitor. However, if a glass is used for the second barrier layer 22, the glass will be present prior to and during wire bonding. In this embodiment, when the wire bond 24 is applied over the second barrier layer 22, the second barrier layer 22 cracks at the corners of the metal regions 18 and over time the remaining portions of the second barrier layer 22 also crack and become disassociated from either the metal regions 18 or the slots 14. It is possible that the finished product after wire bond does not have the second barrier layer 22, even if the second barrier layer 22 is used in the processing sequence. Thus, in one embodiment, the second barrier layer 22 or corrosion barrier layer is penetrated by the wire or wire bond 24 during attaching the wire. In another embodiment, the corrosion barrier or barrier layer 22 is removed while attaching the wire or wire bond 24.

Figure 8:
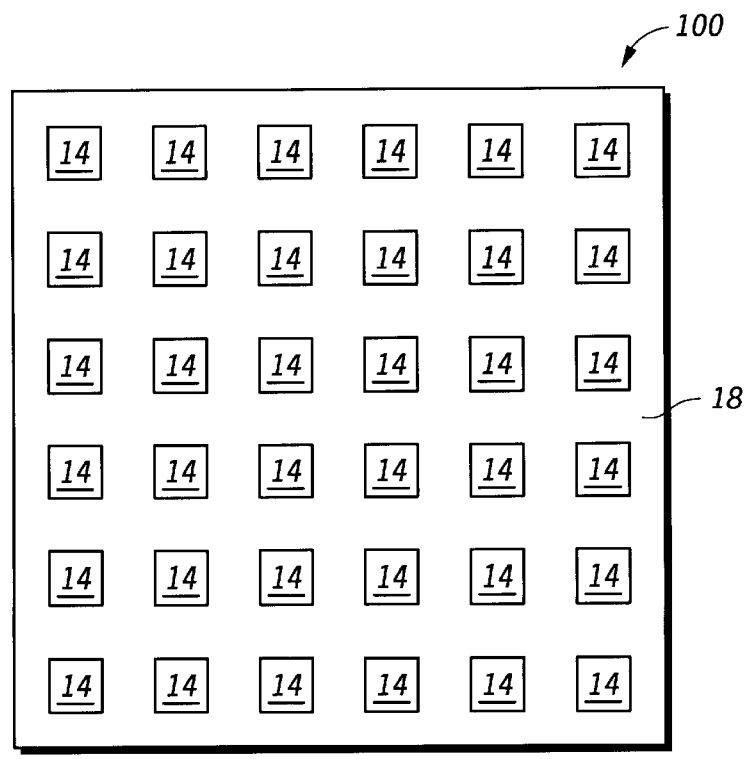
FIG. 8 is a top view of a bond pad in accordance with an embodiment of the present invention.

A topographical view of the bond pad 100 including a plurality of features and a metal layer, which can be copper, around the plurality of features is shown in FIG. 8. In the embodiment shown, the exposed slots 14 are formed in a column and row pattern and are surrounded by metal regions 18; any other pattern and any number of slots 14 can be used. However, the area of metal regions 18 should be at least approximately 34 percent of the bond pad 100 in contact with the wire bond 24. In addition, the slots 14 can be any shape, such as a rectangle, square, or cylinder.

Forming recessed slotted last level metal bond pads is advantageous because the recesses 15 increase the reliability of probe and wire bonding, reduce polishing dishing resulting from chemical mechanical polishing, and control the penetration of the probe 80 into the bond pad 100, thereby limiting bond pad 100 damage during probing. The recesses also allow any debris that has built up on the probe 80 to deposit in at least one recess, thereby cleaning the probe 80. Additionally, the recesses 15 can allow for metal to remain after multiple reprobes. Having remaining metal after probing, especially multiple reprobes, increases the reliability and simplicity of the wire bonding process. In addition, the topography resulting from the recesses 15 aids in wire bonding because the recesses 15 increase the surface area of the metal to which the wire bond 24 can attach to the metal regions 18. Furthermore, the topography allows for the glass barrier layer over the metal regions 18 and slots 14 to more easily fracture, enhancing both bond strength and electrical contact of the bond.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of making a bond pad on a semiconductor substrate; comprising:

forming a dielectric layer over the semiconductor substrate;

patterning the dielectric layer to form a plurality of features in a bond pad region of the dielectric layer;

depositing a copper layer over the dielectric layer, among the plurality of features, and over the plurality of features;

chemical-mechanical polishing the copper layer to form a substantially planar surface comprised of exposed top surfaces of the plurality of features and a top surface of the copper layer after being etched back for directly receiving a probe;

etching back the plurality of features to form recesses in the etched-back copper layer; and applying a barrier layer over the etched-back copper layer and in the recesses.

2. The method of claim 1, further comprising:

forming a passivation layer over the semiconductor substrate; and forming at least a partial opening in the passivation layer over the bond pad region prior to etching back.

3. The method of claim 2, further comprising:

forming a polyimide layer over the passivation layer; and forming at least a partial opening in the polyimide layer over the bond pad region prior to etching back.

4. The method of claim 1, wherein the recesses are recessed from the top surface of the etched-back copper layer by at least 600 angstroms.

5. The method of claim 4, wherein the recesses are recessed from the top surface of the etched-back copper layer by no more than 2000 angstroms.

6. The method of claim 5, wherein the plurality of recesses each has a maximum width dimension that is less than 4 microns.

7. The method of claim 1, wherein the recesses are recessed from the top surface of the etched-back copper layer by between 100–2000 angstroms.

8. The method of claim 7, wherein the features comprise silicon oxide.

9. The method of claim 1, wherein the barrier layer is a corrosion barrier layer and comprises one of a liquid or gel.

10. The method of claim 1, wherein the barrier layer comprises a glass comprising silicon, oxygen, carbon, and hydrogen.

11. A method for making a semiconductor structure, comprising:

providing a semiconductor substrate;

forming a dielectric layer over the substrate;

etching the dielectric layer to form a plurality of features in a bond pad region;

depositing copper over the dielectric layer to form a copper layer over the dielectric layer and a copper fill among and over the features;

removing portions of the copper layer and the copper fill to form a substantially planar surface comprising a top surface of the copper fill and a top surface of each of the features;

recessing the plurality of features to form recesses below the top surface of the copper fill; and attaching a wire directly to the top surface of the copper fill.

12. The method of claim 11, wherein the features comprise an insulating material.

13. The method of claim 12, further comprising forming a barrier layer over the copper fill and in the recesses.

14. The method of claim 13, wherein the barrier is penetrated by the wire when attaching the wire.

15. The method of claim 13, wherein the barrier is removed when attaching the wire.

16. The method of claim 13, wherein the recesses are between 100 and 2000 angstroms below the top surface of the copper fill.

17. A method of making a semiconductor structure, comprising:

providing a substrate;

forming a dielectric layer over the substrate;

etching the dielectric layer to form a plurality of features in a bond pad region;

depositing copper on the dielectric layer to form a copper layer over the dielectric layer and a copper fill among and over the features;

planarizing the copper layer and the copper fill to form a substantially planar surface comprising a top surface of the copper fill for directly receiving a probe and a top surface of each of the features; and recessing the plurality of features to form recesses below the top surface of the copper fill.

18. The method of claim 17, further comprising applying a probe directly to the top surface of the copper fill.

19. The method of claim 18, wherein the features comprise silicon oxide.

20. The method of claim 18, wherein the features are recessed from the top surface of the copper fill by between 100 and 2000 angstroms.

* * * * *

UNITED STATES PATENT AND TRADEMARK OFFICE
CERTIFICATE OF CORRECTION

PATENT NO. : 6,531,384 B1
APPLICATION NO. : 09/952527
DATED : March 11, 2003
INVENTOR(S) : Thomas S. Kobayashi et al.

It is certified that error appears in the above-identified patent and that said Letters Patent is hereby corrected as shown below:

On the Title Page

Item (75) Inventors: Please change inventors from
Thomas S. Kobayashi, Austin, TX (US); Scott K. Pozder, Austin, TX (US)

to: Thomas S. Kobayashi, Austin, TX (US); Scott K. Pozder, Austin, TX (US); Stephen Chu-Chung Lee, Round Rock, TX (US); William M. Williams, Gilbert, AZ (US).

Signed and Sealed this
First Day of February, 2011

David J. Kappos
*Director of the United States Patent and Trademark Office*